US007385813B2

(12) United States Patent
Lin

(10) Patent No.: US 7,385,813 B2
(45) Date of Patent: Jun. 10, 2008

(54) ASSEMBLY STRUCTURE FOR SECURING HEAT-DISSIPATING FAN

(75) Inventor: Linger Lin, Taipei (TW)

(73) Assignee: Inventec Corporation, Taipei (TW)

( * ) Notice: Subject to any disclaimer, the term of this patent is extended or adjusted under 35 U.S.C. 154(b) by 134 days.

(21) Appl. No.: 11/393,446

(22) Filed: Mar. 29, 2006

(65) Prior Publication Data

US 2007/0133169 A1    Jun. 14, 2007

(30) Foreign Application Priority Data

Dec. 14, 2005  (TW) ............................... 94221772 U

(51) Int. Cl.
*H05K 7/20*        (2006.01)
(52) U.S. Cl. ...................... 361/695; 174/15.1; 165/122
(58) Field of Classification Search ..................... None
See application file for complete search history.

(56) References Cited

U.S. PATENT DOCUMENTS

| 5,707,282 A * | 1/1998  | Clements et al. ........... 454/184 |
| 5,788,566 A * | 8/1998  | McAnally et al. ........... 454/184 |
| 6,074,296 A * | 6/2000  | Wu ............................. 454/184 |
| 6,215,659 B1* | 4/2001  | Chen ........................... 361/695 |
| 6,373,698 B1* | 4/2002  | Christensen ................ 361/695 |
| 6,538,888 B1* | 3/2003  | Wei et al. .................... 361/697 |
| 6,611,427 B1* | 8/2003  | Liao ............................ 361/695 |
| 6,643,131 B1* | 11/2003 | Huang ........................ 361/697 |
| 6,779,975 B2* | 8/2004  | Takashima et al. ...... 415/213.1 |
| 6,871,879 B2* | 3/2005  | Gan ............................ 285/189 |
| 6,999,313 B2* | 2/2006  | Shih ........................... 361/695 |
| 7,048,498 B2* | 5/2006  | Kosugi ....................... 415/118 |
| 7,145,771 B2* | 12/2006 | Wang ......................... 361/695 |

FOREIGN PATENT DOCUMENTS

TW           507886       6/1990

* cited by examiner

*Primary Examiner*—Boris Chervinsky
(74) *Attorney, Agent, or Firm*—Jianq Chyun IP Office

(57) ABSTRACT

An assembly structure provided for securing a heat-dissipating fan, includes a casing board and a fan covering for covering the fan, The casing board has ventilation openings, coupling openings and positioning openings, and the fan covering formed with coupling portions and positioning portions secures the fan to a side of the casing board, wherein the coupling portions are coupled to the coupling openings, and the positioning portions are positioned and coupled to the positioning openings, so that the fan is installed at a location allowing wind or airflow to pass through the ventilation openings. Arrangement as such, without using tools during assembling or dissembling processes, allows two heat-dissipating fans to be correspondingly coupled at both sides of the casing board, so as to increase wind force to increase heat dissipation in a simple but convenient way.

10 Claims, 5 Drawing Sheets

ASSEMBLY STRUCTURE FOR SECURING
HEAT-DISSIPATING FAN

FIELD OF THE INVENTION

The present invention relates to assembly structures for securing heat-dissipating fans, and more particularly, to an assembly structure for a securing heat-dissipating fan of an electronic device.

BACKGROUND OF THE INVENTION

Following by improvements of the manufacturing technology for the integrated circuit (IC) design, the integration density of the IC increases continuously. Nowadays, a server is packed with a large amount of IC such as central processors or graphic chips in a tiny space, in order to increase processing speed and reduce space usage; however, operating these IC would also generate a lot of heat within a tiny space. Moreover, the exterior of a server is usually packed with a casing for protection of the server system, however, such arrangement does not allow the heat generated from the interior of the server to be dissipated effectively, thereby influencing operation of the server. Generally speaking, a simple and cheap but effective way of dissipating heat generated in the server is to install a heat-dissipating fan.

Most common models of a heat-dissipating fan for an electronic device such as a server, can be divided into two groups: the models that dissipate heat generated from a particular component, or the models that dissipate heat generated from the entire interior of the server and is installed on the casing thereof. The latter models of the heat-dissipating fan mostly require screwing components such as screws for fastening the fan in the server; however, a user may find it troublesome and inconvenient to fasten the fan via screwing during installation or removal.

Referring to FIGS. 1A and 1B, which are schematic diagrams of a fan fastening structure disclosed in Taiwan Utility Model Publication No. 507886, the fan fastening structure 1 for fastening a heat-dissipating fan 10 to a casing 11 of a computer. The fan fastening structure comprises: at least a board 12 for covering the outer surface of the heat-dissipating fan 10, at least a fan positioning bolt 121 for coupling to at least a screw hole 101 of the heat-dissipating fan 10, and at least a set of coupling member 123 extended and coupled to the casing 11, so that the heat-dissipating fan 10 could be fastened to the casing 11 via the fastening structure 1.

However, as IC design and manufacturing technology have been improved day by day and integration density of IC have been increased constantly, a single heat-dissipating fan can no longer provide sufficient heat dissipation for rapidly and effectively dissipating heat generated from the interior of a server.

Therefore, to overcome the foregoing drawbacks has become an important issue to be resolved.

SUMMARY OF THE INVENTION

In light of the above drawbacks in the prior art, an objective of the present invention is to provide an assembly structure for securing a heat-dissipating fan at either of two opposing sides of an electronic device case.

Another objective of the present invention is to provide an assembly structure for securing a heat-dissipating fan so as to allow the heat-dissipating fan to be installed and removed rapidly and conveniently.

A further objective of the present invention is to provide an assembly structure for securing a heat-dissipating fan so as to increase heat-dissipating efficiency.

In accordance with the above and other objectives, the present invention proposes an assembly structure for securing a heat-dissipating fan. The assembly structure for securing the heat-dissipating fan, comprises a casing board that may be a portion of a casing of any electronic device, and a fan covering for storing and covering the heat-dissipating fan. The casing board is formed with at least a ventilation opening, at least a coupling opening and at least a positioning opening. The fan covering formed with at least a coupling portion and at least a positioning portion secures the heat-dissipating fan to a side of the casing board, wherein the coupling portion is coupled to the coupling opening and the positioning portion is positioned and coupled to the positioning opening so as to secure the coupling portion to the coupling opening, so that the heat-dissipating fan is installed at a position allowing wind or airflow to pass through the ventilation opening. Arrangement as such allows two heat-dissipating fans to be correspondingly coupled at both sides of the casing board, so as to increase wind force to increase heat dissipation.

The casing board may be assembled to at least one of a server, a personal computer and an electronic device that can install a heat-dissipating fan on the casing thereof. Further, the casing board may have at least two sets of coupling openings and positioning openings, so as to allow more than one set of the fan covering and heat-dissipating fan to be individually secured to the two opposing sides of the casing board. Furthermore, as different sets of the coupling openings and positioning openings may be formed adjacently to each other, different sets of the fan covering and heat-dissipating fan may be correspondingly coupled to the two opposing sides of the casing board so as to combine wind force generated from the heat-dissipating fans to increase airflow and improve air circulation for increasing heat dissipation. The fan covering comprises a frame that may directly cover the heat-dissipating fan, and a fan guard that may be formed at an open-side (outside face) of the frame to cover the outer open-side of the frame. Further, the coupling portions and the positioning portions may be peripherally formed at the other open-side (inside face) of the frame, wherein the coupling portions may be formed evenly around the outer open side of the frame for equally sharing the pressure and tension of the fan covering. The coupling portion may be a hooking structure. Several hook-shaped coupling portions may be formed at the end of protruding plates that are perpendicularly connected to the frame, wherein the protruding plates are extending outwardly from the body of the fan covering, so that the hook-shaped coupling portions are formed outside of the frame in order to avoid blocking the open side of the frame. The foregoing arrangement allows the fan covering to be fabricated by performing a single process, double-side molding process, so as to save the cost of molding. The positioning portion may be a positioning strip formed on an extension plate. The extension plate is perpendicularly connected to the inner open-side of the frame and extending toward a direction that is away from the frame. An operation portion may be formed and perpendicularly connected to the extension plate, wherein a protrusion portion 2262 may be formed at the end the operation portion so as to facilitate operation.

When the heat-dissipating fan is to be secured to the casing board, first the heat-dissipating fan is coupled to the fan covering, then, the operation portion is held to couple the coupling portions to the coupling openings, and the positioning portions are coupled to the positioning openings, so that the fan covering is secured to a side of the casing board. Another heat-dissipating fan could also be secured to the other side of the casing board by performing the aforementioned steps, so as to enhance heat dissipation efficiency.

Comparing with the prior art, the assembly structure purposed in the present invention for securing the heat-dissipating fan, does not require tools for securing the heat-dissipating fan. In other words, the present invention provides an assembly structure that could be assembled and secured without using tools, so as to increase assembly speed and reduce the assembling time.

Further, the conventional fastening structure cannot secure an extra heat-dissipating fan on the outer side of the server; however, the assembly structure purposed in the present invention for securing the heat-dissipating fan, allows the heat-dissipating fans to be individually secured to both sides (outside and inside faces) of the casing board, such that an extra heat-dissipating fan may be rapidly installed to increase the heat dissipation in a server or an electronic device instantly, if required.

Moreover, the fan covering of the assembly structure for coupling to the heat-dissipating fan in the present invention, may be fabricated by performing a single process, double-side molding process, so as to save the cost of production effectively.

Accordingly, as abovementioned, the assembly structure of the present invention for securing the heat-dissipating fan, overcomes the drawbacks exiting in prior art as well as reduces the cost of production, and thus has high industrial applicability.

DETAILED DESCRIPTION OF THE PREFERRED EMBODIMENT

Figure 1A:
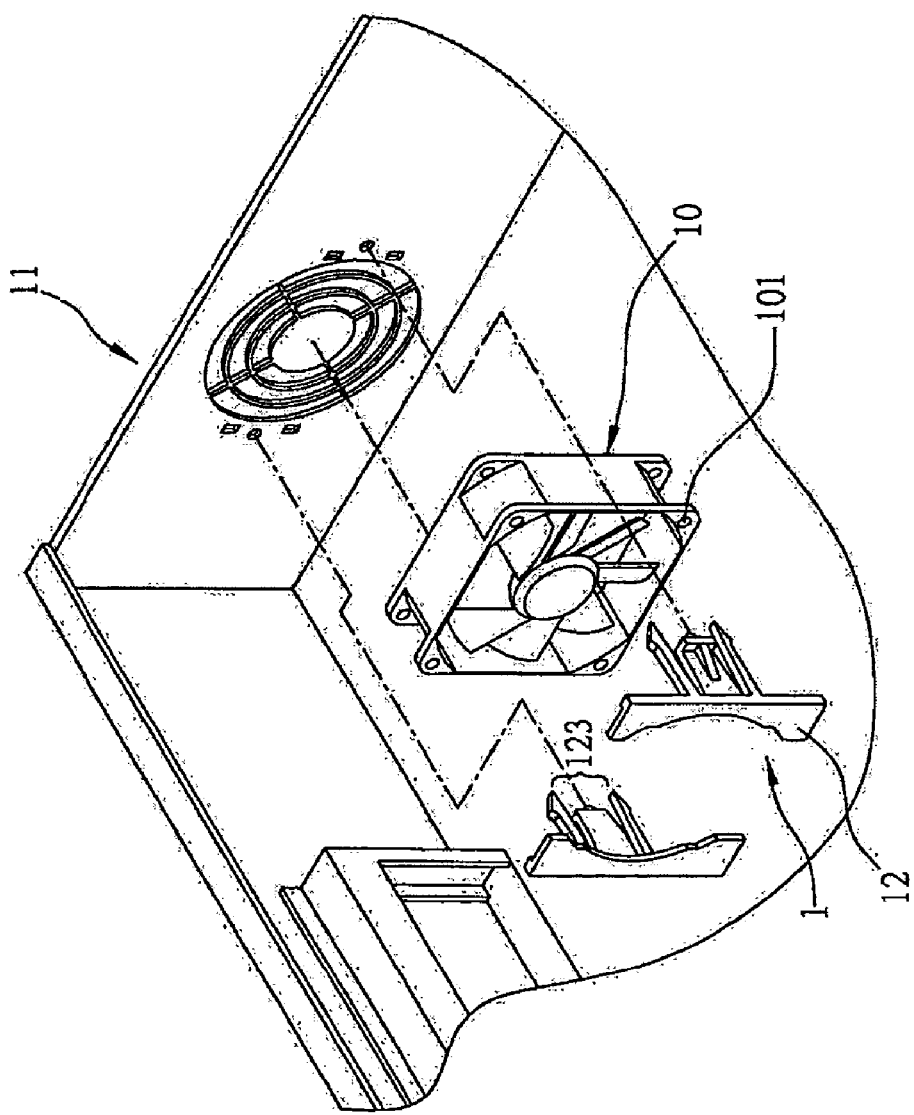
FIGS. 1A and 1B (PRIOR ART) are schematic diagrams of a fan fastening structure disclosed in Taiwan Utility Model Publication No. 50788.
Figure 1B:
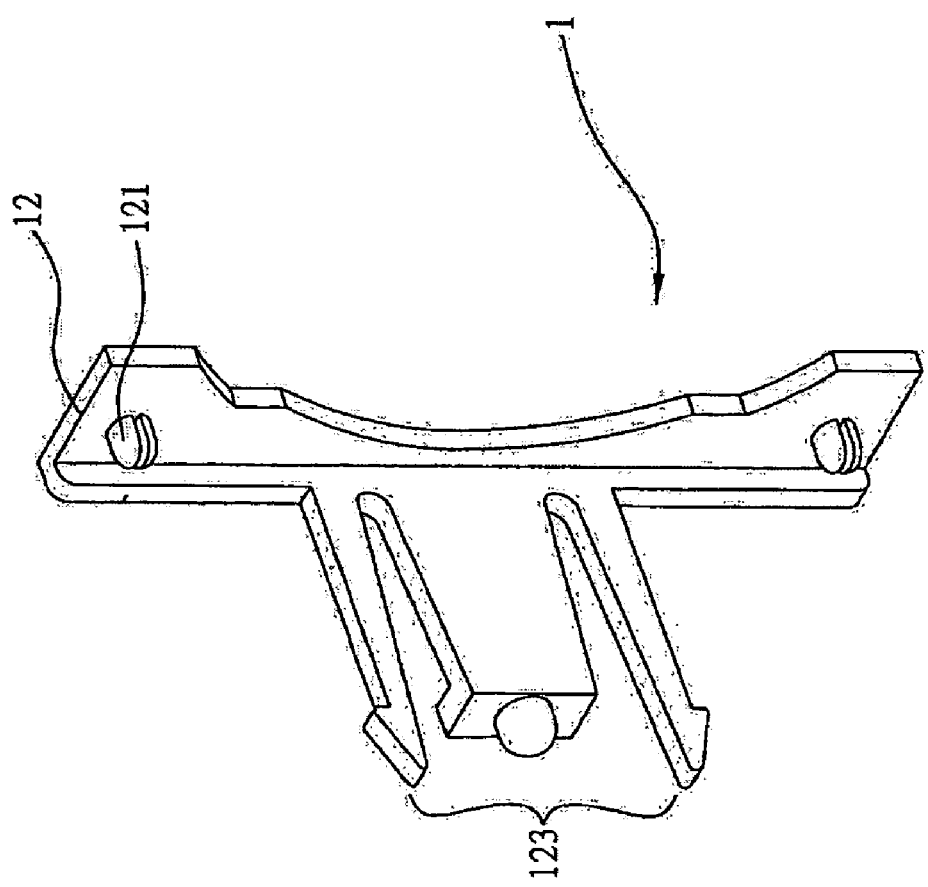
Figure 2:
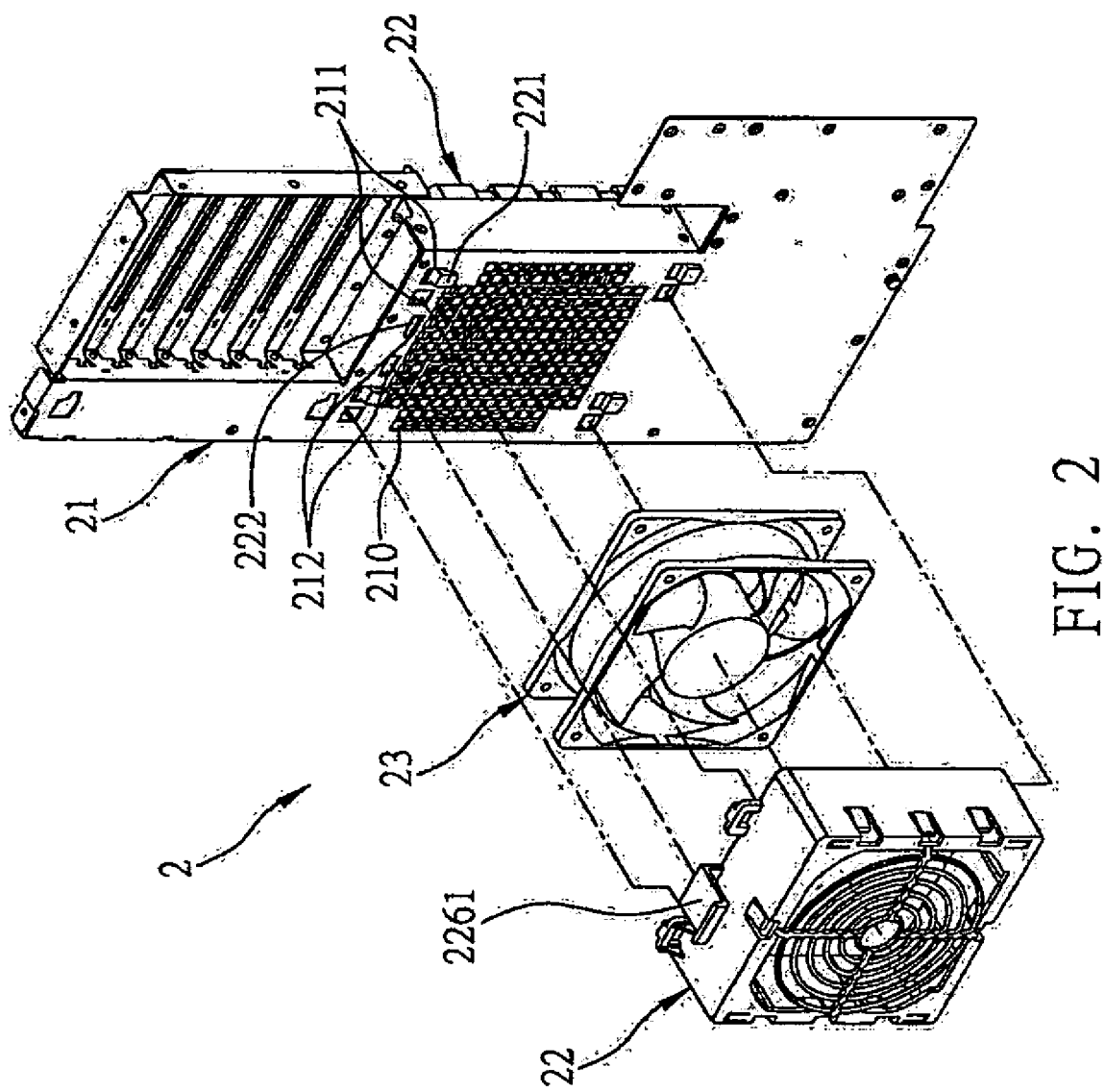
FIG. 2 is an exploded diagram showing an assembly structure for securing a heat dissipating fan according to an exemplary preferred embodiment of the present invention.

FIG. 2 is an exploded diagram showing an assembly structure for securing a heat-dissipating fan according to an exemplary preferred embodiment of the present invention. The assembly structure 2 for securing a heat dissipating fan, comprises a casing board 21 that may be a portion of a casing of an electronic device, and a fan covering 22 for storing and covering a heat-dissipating fan 23, wherein the casing board 21 of the electronic device is assembled to at least one of a server, a personal computer and an electronic device that can install a heat-dissipating fan on the casing thereof.

The casing board 21 is formed with at least a ventilation opening 210, at least a coupling opening 211 and at least a positioning opening 212. The fan covering 22 is formed with at least a coupling portion 221 and at least a positioning portion 222, secures the heat-dissipating fan 23 to a side of the casing board 21, wherein the coupling portion 221 is coupled to the coupling opening 211 and the positioning portion 222 is positioned and coupled to the positioning opening 212 so as to secure the coupling portion 221 to the coupling opening 211, so that the heat-dissipating fan 23 is installed at location allowing wind or airflow to pass through the ventilation opening 210.

The fan covering 22 may also secure the heat-dissipating fan 23 on the other side of the casing board 21 (that is the opposite to the foregoing side). In other words, the fan covering 22 may secure the heat-dissipating fan 23 on either of the two opposing sides of the casing board 21 at a time, or simultaneously secure more than one heat-dissipating fans 23 on both sides of the casing board 21 to increase wind power, so as to enhance heat dissipation efficiency to increase heat dissipation.

In one embodiment, the casing board 21 may have at least two sets of coupling openings 211 and positioning openings 212, so as to allow more than one set of the fan covering 22 and heat-dissipating fan 23 to be individually secured to the two opposing sides of the casing board 21. Further, as different sets of the coupling openings 211 and positioning openings 212 are formed adjacently to each other, different sets of the fan covering 22 and heat-dissipating fan 23 may be correspondingly coupled to the two opposing sides of the casing board 21 so as to combine wind force generated from the heat-dissipating fans 23 to increase airflow and improve air circulation for increasing heat dissipation.

Figure 3:
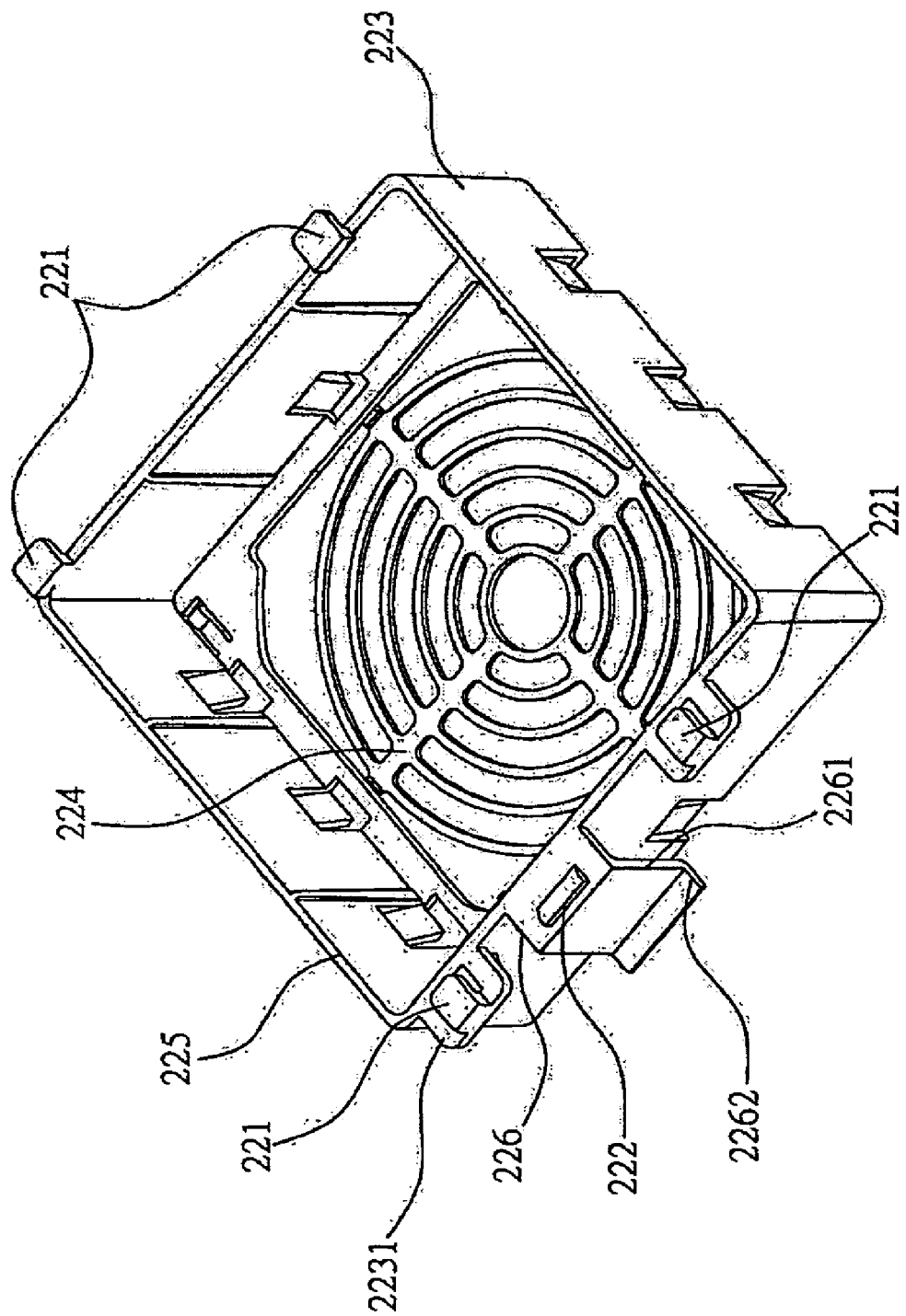
FIG. 3 is a schematic diagram showing a fan covering of an assembly structure for securing heat-dissipating fan according to the present invention.

Referring to FIG. 3, which is a schematic diagram showing a fan covering of an assembly structure for securing heat-dissipating fan according to the present invention, the fan covering 22 comprises a frame 223 that may directly cover the heat-dissipating fan 23, and a fan guard 224 that is formed at an open-side (outside face) of the frame 223 to cover the outer open-side of the frame 223. The frame 223 may be a rectangular or an annular structure, or a ring-shape structure and the like; the fan guard 224 may be a web-like structure, a grid-like structure and the like. Further, the coupling portions 221 and the positioning portions 212 are peripherally formed at the other open-side 225 (inside face) of the frame 223, wherein the amount of the coupling portions 221 are formed evenly around the open side 225 of the frame 223 for equally sharing the pressure and tension of the fan covering 22.

The coupling portion 221 may be a hooking structure or a clamping structure. In one embodiment, several hook-shaped coupling portions 221 are formed at the end of protruding plates 2231 that are perpendicularly connected to the frame 223, wherein the protruding plates 2231 are extending outwardly from the body of the fan covering 22, so that the hook-shaped coupling portions are formed outside of the frame 223 in order to avoid blocking the open side of the frame 223. As a result, the fan covering 22 may be fabricated by performing a single process, double-side molding process, so as to save the cost of production.

The positioning portion 222 may be a positioning strip formed on an extension plate 226 that is extending from and perpendicularly connected to the frame 223. The extension plate 226 is further formed with an operation portion 2261 that is parallel to the frame 223, extending toward the fan guard 224 and formed with a protrusion portion 2262 at the end thereof so as to facilitate operation.

Figure 4:
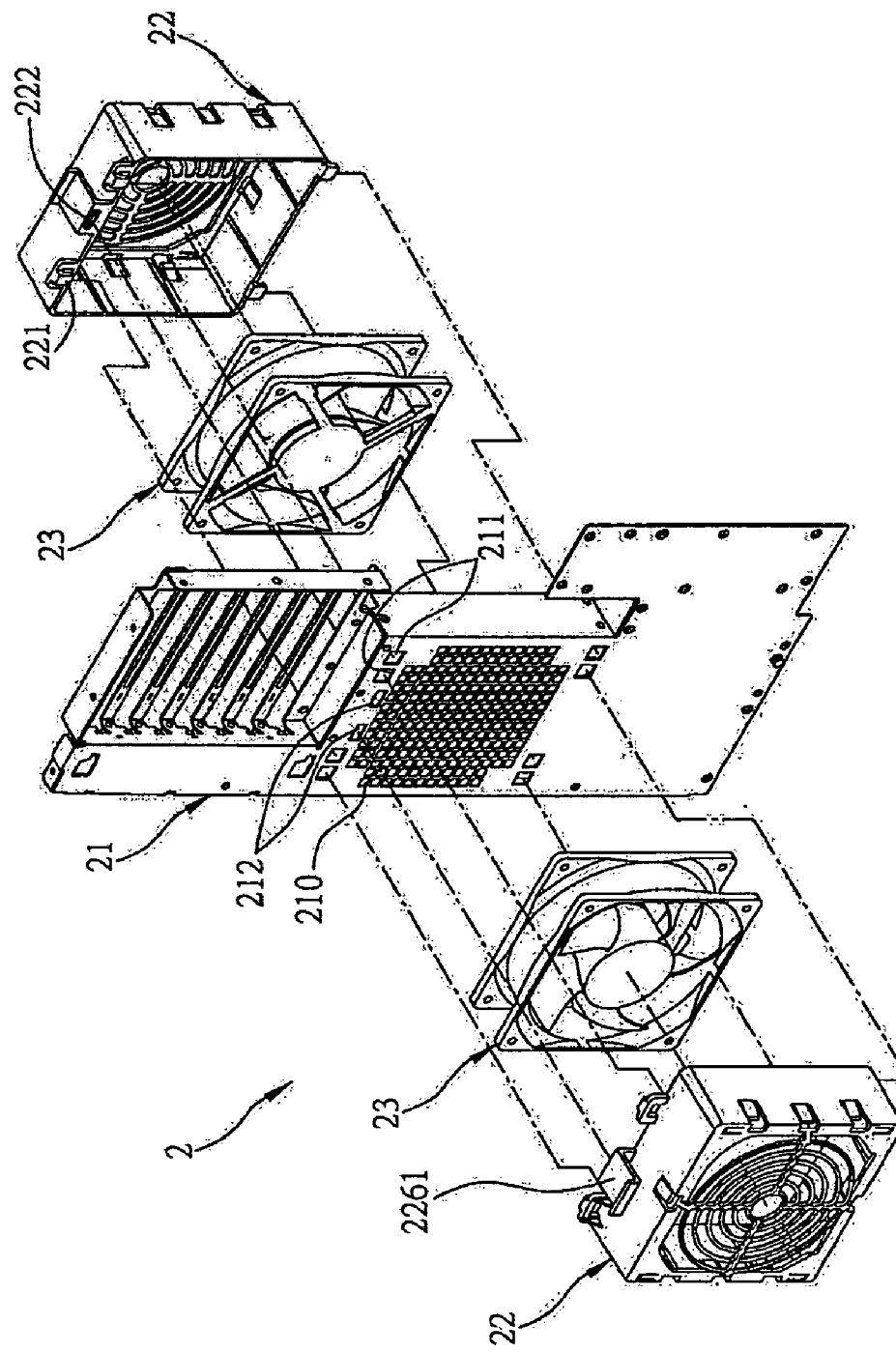
FIG. 4 is a schematic diagram showing two sets of assembly structure securing two heat-dissipating fans to two opposing sides of a casing board according to a preferred embodiment of the present invention.

FIG. 4 is a schematic diagram showing two sets of assembly structure securing two heat-dissipating fans to two opposing sides of a casing board according to a preferred embodiment of the present invention. When the heat-dissipating fan 23 is to be secured to the casing board 21 first the heat-dissipating fan 23 is coupled to the fan covering 22, then, the operation portion 2261 is held to couple the coupling portions 221 to the coupling openings 211, and the positioning portions 222 are coupled, to the positioning openings 212, so that the fan covering 2 coupled with the heat-dissipating fan 23 is secured to a side of the casing board 21. Arrangement as such provides a strong and firm binding that could only be pulled off or removed intentionally, and passes the falling object test. Another heat-dissipating fan 23 could be secured to the other side of the casing board by performing the aforementioned steps, so as to enhance heat dissipation efficiency. Additionally, when the coupling portions 221 are coupled to the coupling openings 211, the coupling portions 221 of the two fan coverings 22 do not interfere with each other. Moreover, when the positioning portions 222 are coupled to the positioning openings 212, the positioning portions 222 of the two fan coverings 22 do not interfere with each other.

Comparing with the prior art, the assembly structure purposed in the present invention for securing the heat-dissipating fan, does not require tools for securing the heat-dissipating fan. In other words, the present invention provides an assembly structure that could be assembled and secured without using tools, so as to increase assembly speed and reduce the assembling time.

Further, the assembly structure purposed in the present invention for securing the heat-dissipating fan, allows the heat-dissipating fans to be individually secured to both sides (outside and inside faces) of the casing board, such that an extra heat-dissipating fan may be rapidly installed to increase the heat dissipation in a server or an electronic device instantly, if required.

Moreover, the fan covering of the assembly structure for coupling to the heat-dissipating fan in the present invention, could be fabricated by performing a double-side molding process, so as to save the cost of production effectively.

Accordingly, as abovementioned, the assembly structure of the present invention for securing the heat-dissipating fan, overcomes the drawbacks exiting in prior art as well as reduces the cost of production, and thus has high industrial applicability.

The present invention described above has been using exemplary preferred embodiments. However, it is to be understood that the scope of the present invention is not limited to the disclosed embodiments. It is intended to cover various modifications and similar arrangements, therefore, the scope of the claims should be accorded the broadest interpretation so as to encompass all such modifications and similar arrangements.

What is claimed is:

1. An assembly structure for securing two heat-dissipating fans, comprising:
   a casing board mounted to an electronic device, wherein the casing board is formed with at least a ventilation opening, a first opening set and a second opening set, each of the first and second opening sets comprises at least one coupling opening and at least one positioning opening;
   a first fan covering for securing one of the two heat-dissipating fans to one of two opposing sides of the casing board, the first fans covering having at least one coupling portion and at least one positioning portion formed on the first fan covering, wherein the coupling portion of the first fan covering is coupled to the coupling opening of the first opening set, and the positioning portion of the first fan covering is positioned and coupled to the positioning opening of the first opening set; and
   a second fan covering for securing the other of the two heat-dissipating fans to the other of the two opposing sides of the casing board, the second fan covering having at least one coupling portion and at least one positioning portion formed on the second fan covering, wherein the coupling portion of the second fan covering is coupled to the coupling opening of the second opening set, the positioning portion of the second fan covering is positioned and coupled to the positioning opening of the second opening set, and the first fan covering and the second fan covering are respectively located at the two opposing sides of the casing board, so that the two heat-dissipating fans are installed at positions allowing wind or airflow to pass through the ventilation opening.

2. The assembly structure of claim 1, wherein the coupling opening of the first opening set is adjacent to the coupling opening of the second opening set, the positioning opening of the first opening set is adjacent to the positioning opening of the second opening set, so as to allow the two heat-dissipating fans to be correspondingly coupled to the two opposing sides of the casing board to combine wind force generated from the heat-dissipating fans thereby increasing heat dissipation.

3. The assembly structure of claim 1, wherein the fan covering comprises a frame for covering the heat-dissipating fan, and a fan guard that is formed at one open-side of the frame so as to cover the open-side of the frame, wherein the coupling portion and the positioning portion are peripherally formed at the other open-side of the frame.

4. The assembly structure of claim 3, wherein the coupling portion is a hooking structure and the positioning portion is a positioning strip.

5. The assembly structure of claim 3, wherein the at least a coupling portion comprises a plurality of coupling portions formed evenly around the other open-side of the frame, for equally sharing pressure and tension of the fan covering.

6. The assembly structure of claim 4, wherein a plurality of hook-shaped coupling portions are formed at ends of protruding plates that are perpendicularly connected to the frame, wherein the protruding plates are extended outwardly from the fan covering, so that the hook-shaped coupling portions are formed outside of the frame.

7. The assembly structure of claim 4, wherein the positioning strip is formed on an extension plate perpendicularly connected to the other open-side of the frame and extended toward a direction away from the frame.

8. The assembly structure of claim 7, wherein the extension plate is perpendicularly connected to an operation portion that is extended toward the fan guard and formed with a protrusion portion at an end thereof so as to facilitate operation.

9. The assembly structure of claim 1, wherein the casing bard is assembled to at least one of a server, a personal computer and the electronic device that allows the heat-dissipating fan to be installed on a casing thereof.

10. The assembly structure of claim 1, wherein the coupling portion of the first fan covering does not interfere with the coupling portion of the second fan covering, and the positioning portion of the first fan covering does not interfere with the positioning portion of the second fan covering.

* * * * *